US008228218B2

(12) United States Patent
Eldar et al.

(10) Patent No.: US 8,228,218 B2
(45) Date of Patent: Jul. 24, 2012

(54) METHOD AND APPARATUS FOR RECONSTRUCTING DIGITIZED DISTORTED SIGNALS

(75) Inventors: Yonina Eldar, Haifa (IL); Tsvi Gregory Dvorkind, Yokneam (IL)

(73) Assignee: Technion Research and Development Foundation Ltd., Haifa (IL)

( * ) Notice: Subject to any disclaimer, the term of this patent is extended or adjusted under 35 U.S.C. 154(b) by 112 days.

(21) Appl. No.: 12/739,745

(22) PCT Filed: Oct. 29, 2008

(86) PCT No.: PCT/IL2008/001425
§ 371 (c)(1),
(2), (4) Date: Apr. 26, 2010

(87) PCT Pub. No.: WO2009/057110
PCT Pub. Date: May 7, 2009

(65) Prior Publication Data
US 2010/0259428 A1    Oct. 14, 2010

Related U.S. Application Data

(60) Provisional application No. 60/983,637, filed on Oct. 30, 2007.

(51) Int. Cl.
*H03M 1/10* (2006.01)
(52) U.S. Cl. ........... 341/118; 341/110; 702/86; 702/190
(58) Field of Classification Search .................. 341/110, 341/118, 120; 702/86, 189–196
See application file for complete search history.

(56) References Cited

U.S. PATENT DOCUMENTS

| 5,568,400 | A | * | 10/1996 | Stark et al. ..................... 702/85 |
| 6,999,510 | B2 | * | 2/2006 | Batruni ........................ 375/239 |
| 8,032,336 | B2 | * | 10/2011 | Batruni ........................ 702/190 |
| 2002/0121993 | A1 | * | 9/2002 | Velazquez ..................... 341/118 |
| 2005/0212596 | A1 | * | 9/2005 | Batruni ........................ 330/149 |
| 2007/0244669 | A1 | * | 10/2007 | Vogel et al. ................... 702/190 |

OTHER PUBLICATIONS

Dogancay, K.; Blind Compensation of Nonlinear Distortion for Bandlimited Signals; IEEE Transactions on Circuits and Systems I: Regular Papers; vol. 52 , Issue:9 on pp. 1872-1882, Sep. 2005.*
Bako T.B.. et al.; Unbiased Reconstruction of Nonlinear Distortions; Proceedings of the 19th IEEE Instrumentation and Measurement Technology Conference, 2002, vol. 2 on pp. 1099-1102 vol. 2.*
Dogancay, K.; LMS Algorithm for Blind Adaptive Nonlinear Compensation; TENCON 2005 IEEE Region 10 Issue Date : Nov. 21-24, 2005; on pp. 1-6; Print ISBN: 0-7803-9311-2; INSPEC Accession No. 10206280.*
Raich, R.; Subspace Based Approaches for Wiener System Identification; IEEE Transactions on Automatic Control, vol. 50, No. 10, Oct. 2005; pp. 1629-1634.*

(Continued)

*Primary Examiner* — Howard Williams

(57) ABSTRACT

A method of reproducing an original analog signal modified by a distortion and sampled. The distortion may be linear or nonlinear, and the samples may be either ideal or non-ideal. The method determines a stationary point of a cost function based on an error vector. The method iteratively computes approximated analog signals until the approximated analog signals converge to the original analog signal. The method may utilize Fr?chet derivatives and Moore-Penrose pseudo inverse transformations in order to iteratively compute the original analog signal. An apparatus performing said method is also disclosed.

24 Claims, 5 Drawing Sheets

OTHER PUBLICATIONS

Schetzen; Nonlinear System Modeling Based on the Wiener Theory; Proceedings of the IEEE, vol. 69, No. 12, Dec. 1981.*

Tsimbinos et al.; Nonlinear System Compensation Based on Orthogonal Polynomial Inverses; IEEE Transactions on Circuits and Systems: Fundamental Theory and Applications, vol. 48, No. 4, Apr. 2001.*

Tsimbinos et al.; Input Nyquist Sampling Suffices to Identify and Compensate Nonlinear Systems; IEEE Transactions on Signal Processing, vol. 46, No. 10, Oct. 1998; p. 2833.*

Surinthiran et al.; Signal Recovery and Noise Removal with Memoryless Nonlinear Sensors; Proceedings of the 2003 American Contorl Conference; Jun. 2003, vol. 5 p. 4155; IEEE, Inspec Accession No. 7832366.*

* cited by examiner

METHOD AND APPARATUS FOR RECONSTRUCTING DIGITIZED DISTORTED SIGNALS

CROSS-REFERENCE TO RELATED APPLICATIONS

The present invention claims priority of the filing date of provisional patent application Ser. No. 60/983,637 titled RECONSTRUCTION OF SIGNALS FROM NONLINEAR AND GENERALIZED SAMPLES, filed Oct. 30, 2007, the contents of which is hereby incorporated by reference herein.

BACKGROUND OF THE INVENTION

1. Field of the Invention

The present disclosure relates to signal processing in general, and to reconstruction of distorted signals from discrete samples, in particular.

2. Description of Related Art

Digital signal processing applications are often concerned with the ability to store and process discrete sets of numbers, which are related to continuous-time signals through an acquisition process. While an analog continuous-time signal may be required by an application, only its discrete samples are often provided and processed by modern digital signal processing equipment.

In the art of digital signal processing, an analog signal is sampled by an analog-to-digital converter (ADC), such as sigma-delta ADC, pipeline ADC and the like, thus acquiring a discrete set of values of the signal at various times. The sampling process is also referred to as digitizing the analog signal. In some cases, it is desired to compute the original analog signal, or even reproduce it using a digital-to-analog converter (DAC). In several scenarios it may be desired to perform a calculation of some sort based on the original analog signal, and to that end, a determination of the original analog signal is required. In some setups, the original analog signal may be computed mathematically using its samples. In some cases, an original analog signal may be approximated by a bandlimited signal to allow for computation of the original analog signal.

In many scenarios, the ADC obtains samples of a distorted version of the original signal. The distortion may be caused by various factors, such as a sensor or an ADC itself. The distortion may be linear or nonlinear, as is known in the art. The distortion may further be memoryless or dynamic, as is known in the art. For example, in the field of digital image processing, CCD image sensors introduce memoryless, nonlinear distortions when excessive light intensity causes saturation. A phase distortion is an exemplary linear distortion caused by a phase shift introduced by a sensor.

The distortion may be introduced intentionally, for example in order to increase the possible dynamic range of the signal while avoiding amplitude clipping, or damage to the ADC.

When such distortions are introduced before the original signal is sampled, current state of the art techniques may not be able to compute the original signal, as desired.

Non-ideal samplers, such as samplers that contain low-pass filters, as are known in the art, introduce an additional setback. In case a distortion is introduced and a non-ideal sampler is utilized to obtain samples of the distorted signal, a method of computing the original signal is not known.

In view of the foregoing, there is a need for an apparatus and method capable of reconstructing an original analog signal based on a set of sampled values of a distorted version obtained by a non-ideal sampler.

BRIEF SUMMARY OF THE INVENTION

An aspect of an embodiment of the disclosed subject matter relates to an apparatus and method for recovering an original analog signal from samples of the original analog signal.

It is a first object of the subject matter to disclose a method for recovering an original analog signal from a sampling of the original analog signal, the original analog signal is modified by a first distortion and sampled by a first digitizing process, the method comprising: obtaining a first signal representing an initial analog signal; reconstructing the original analog signal by: applying a second distortion on the first signal as a function of the first distortion thus obtaining a second signal representing a distorted version of the initial analog signal; sampling the second signal by a second digitizing process substantially equivalent to the first digitizing process thus obtaining a sampling of the second signal; providing a reconstructed analog signal based on the sampling of the original analog signal and the sampling of the second signal; and outputting a signal based on the reconstructed analog signal.

In some exemplary embodiments of the disclosed subject matter, reconstructing the original analog signal is performed in a digital domain.

In other exemplary embodiments of the disclosed subject matter, reconstructing the original analog signal is performed in an analog domain.

In some exemplary embodiments of the disclosed subject matter, the step of obtaining the initial analog signal comprises generating the initial analog signal as a function of known characteristics of the original analog signal.

In some exemplary embodiments of the disclosed subject matter, the distortion is a nonlinear distortion.

In some exemplary embodiments of the disclosed subject matter, the first digitizing process is a non-ideal sampling process.

In some exemplary embodiments of the disclosed subject matter, the original analog signal represents audio data.

In some exemplary embodiments of the disclosed subject matter, the original analog signal represents visual or image data.

In some exemplary embodiments of the disclosed subject matter, the original analog signal represents temperature, air pressure or chemical process.

In some exemplary embodiments of the disclosed subject matter, the original analog signal is an electrical or electromagnetic signal.

In some exemplary embodiments of the disclosed subject matter, step of reconstructing the original analog signal further comprises a step of computing an additional analog signal using an error vector based on the sampling of the second signal and samples of the original analog signal, wherein the additional analog signal is based on the initial analog signal; and the step of providing the reconstructed analog signal is based on the additional analog signal.

In some exemplary embodiments of the disclosed subject matter, the step of reconstructing the original analog signal is performed in order to determine a stationary point in an error function based on the error vector.

In some exemplary embodiments of the disclosed subject matter, the step of reconstructing the original analog signal is performed iteratively.

In some exemplary embodiments of the disclosed subject matter, the step of iteratively reconstructing the original analog signal is completed upon a sufficient convergence of the additional analog signal or upon determination that the additional analog signal is substantially equivalent to the original analog signal.

In some exemplary embodiments of the disclosed subject matter, the first digitizing process is a non-ideal sampling process.

In some exemplary embodiments of the disclosed subject matter, the determination of the stationary point utilizes an inductive equation; the inductive equation is $a_{n+1} = a_n - \alpha_n e(a_n)$.

In some exemplary embodiments of the disclosed subject matter, the determination of the stationary point utilizes a derivative.

In some exemplary embodiments of the disclosed subject matter, the determination of the stationary point utilizes an inductive equation; the inductive equation is $a_{n+1} = a_n - \alpha_n (S^* M'_n A)^\dagger e(a_n)$.

It is a second object of the subject matter to disclose an apparatus for reconstructing an original analog signal; the apparatus receiving samples of a distorted version of the original analog signal; the apparatus comprises: a distorting module for applying a first distortion on a signal representing an analog signal; the first distortion is substantially equivalent to a second distortion affected the original analog signal; a sampler for sampling a signal representing an analog signal; the sampler for performing sampling substantially equivalent to a sampling process that obtained the samples of the distorted version of the original analog signal; and a processing module for computing a first approximated analog signal.

In some exemplary embodiments of the disclosed subject matter, the processing module computes the first approximated analog signal based on an initial analog signal or a second approximated analog signal; the first approximated analog signal computed based on a second approximated analog signal is a changed approximation.

In some exemplary embodiments of the disclosed subject matter, the changed approximation is a refined approximation.

In some exemplary embodiments of the disclosed subject matter, the apparatus further comprising an error estimation module.

In some exemplary embodiments of the disclosed subject matter, the first distortion is a nonlinear distortion.

In some exemplary embodiments of the disclosed subject matter, the sampler is a non-ideal sampler.

In some exemplary embodiments of the disclosed subject matter, the apparatus further comprising a digital-to-analog converter.

In some exemplary embodiments of the disclosed subject matter, at least one of the distorting module, the sampler and the processing module operate in a digital domain.

In some exemplary embodiments of the disclosed subject matter, the distorting module utilizes a module that caused the first distortion.

In some exemplary embodiments of the disclosed subject matter, the sampler utilizes sampler module that performed the sampling process that obtained the samples of the distorted version of the original analog signal.

BRIEF DESCRIPTION OF THE DRAWINGS

The present invention will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

A technical problem dealt with in the subject matter is to reconstruct an analog signal that was distorted before being sampled. The distortion may be of a linear or a nonlinear form. A sampler is utilized to acquire the analog signal. In some exemplary embodiments of the disclosed subject matter, a subset comprising the analog signal is known at the time the disclosed subject matter is utilized.

One technical solution is a method to compute the original analog signal based on an inverted version of the distortion. Another technical solution is a method that iteratively computes the original analog signal based on a linearized approximation of a distorted version of the original analog signal. In some exemplary embodiments of the disclosed subject matter, the linearized approximation is changed in each iterative step until two consecutive linearized approximations substantially converge. In some exemplary embodiments of the disclosed subject matter, the linearized approximation is changed to a refined approximation. In other exemplary embodiments of the disclosed subject matter, the iterations terminate upon determination that the linearized approximation is substantially equivalent to the original analog signal, as described below.

Figure 1:
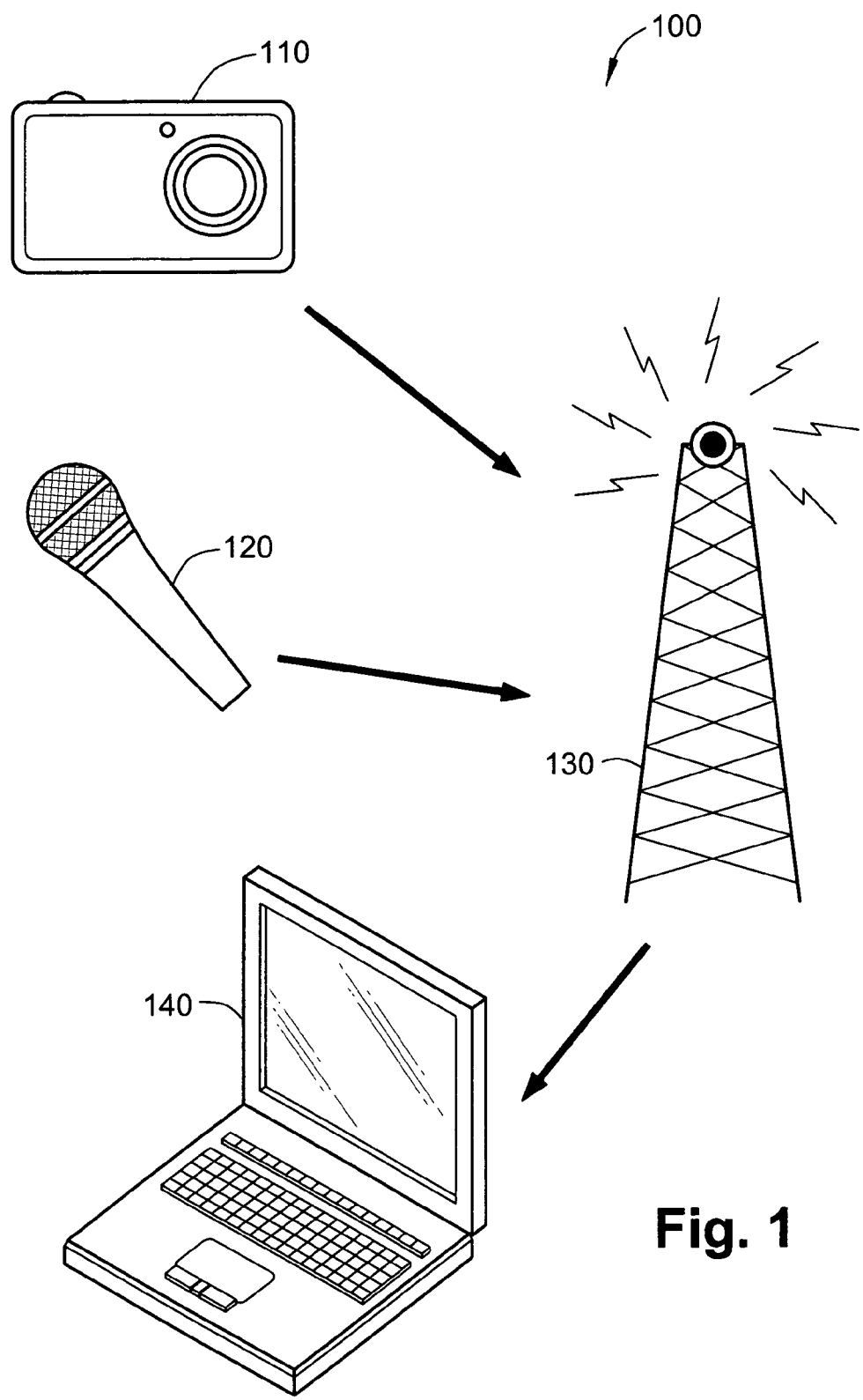
FIG. 1 shows a diagram of an environment 100 in which the disclosed method and apparatus can be implemented and used, in accordance with some exemplary embodiments of the disclosed subject matter.

FIG. 1 shows a diagram of an environment 100 in which the disclosed method and apparatus can be implemented and used, in accordance with some exemplary embodiments of the disclosed subject matter. The environment 100 comprises a first obtaining device 110 that obtains an analog signal representing visual or image data. The environment 100 may also comprise a second obtaining device 120 that obtains an analog signal representing audio data. The first obtaining device 110 and the second obtaining device 120 are exemplary devices that obtain analog signals representing data of different categories and other devices may be utilized to obtain analog signals representing data of other categories such as electrical signal, chemical process, pressure or temperature. An obtaining device, such as the first obtaining device 110, transfers an original analog signal to a processing device 140, such as a personal computer, server, DSP device or application and the like. The processing device 140 comprises an ADC (not shown) to obtain samples of an analog signal, such as the original analog signal. The processing device 140 further comprises a recovering module, such as

Figure 3:
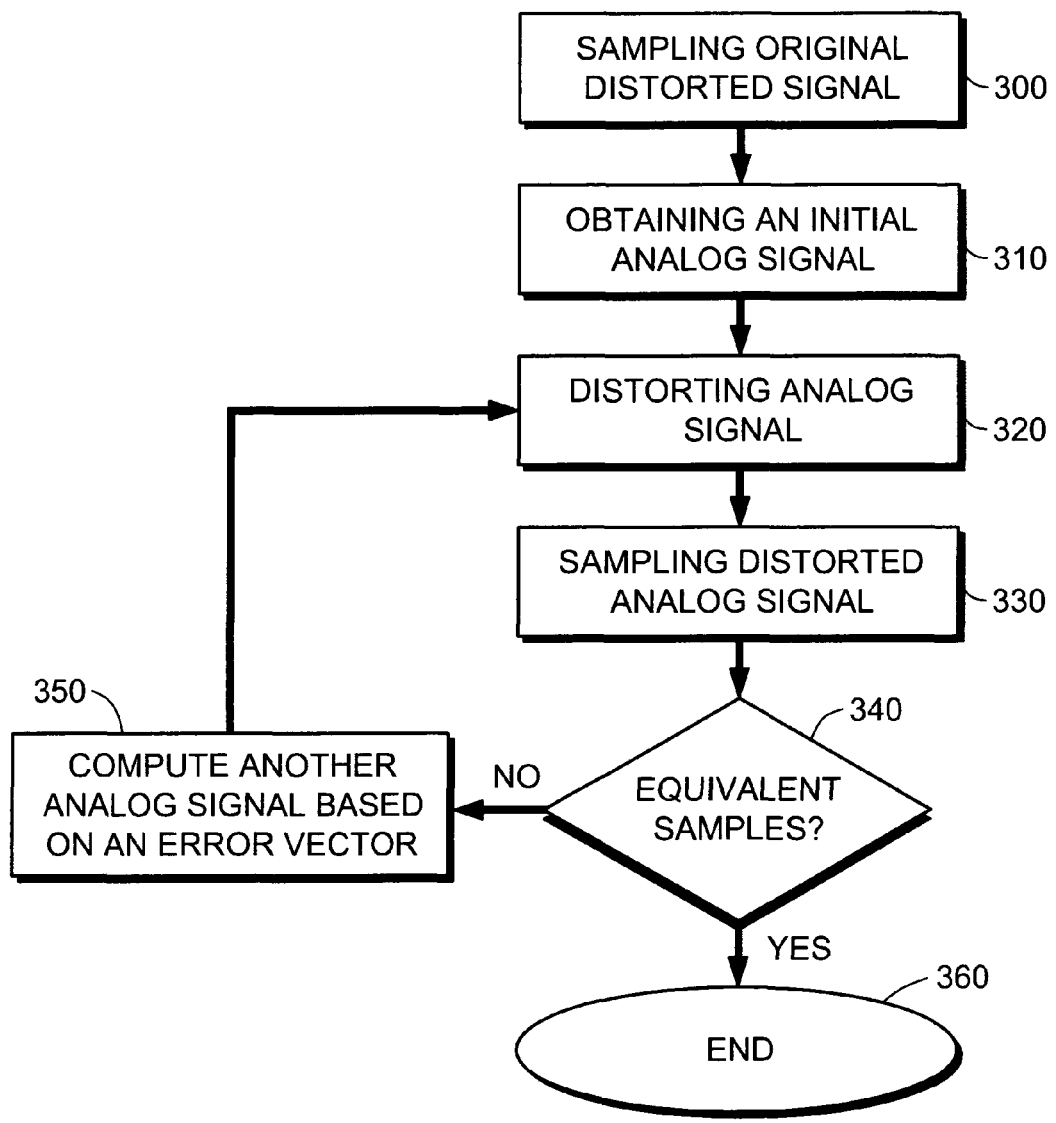
FIG. 3 shows a flow diagram of a method for reconstructing an original analog signal that was distorted by a first distortion and sampled by a first sampler, in accordance with some exemplary embodiments of the disclosed subject matter.

300 of FIG. 3, to generate a reconstructed analog signal substantially equivalent to the original analog signal. The original analog signal is transferred to the processing device 140 via a communication infrastructure 130, such as fiber optic cables, copper cables or radio transmissions. An obtaining device such as the first obtaining device 110, the communication infrastructure 130, and the processing device 140 may reside in a single location or in several remote locations. A single apparatus, such as a digital camera, may comprise at least a subset of an obtaining device such as the first obtaining device 110, the communication infrastructure 130, and the processing device 140. In some other cases, the subset may be coupled to each other in a manner desired by a person skilled in the art.

Figure 2:
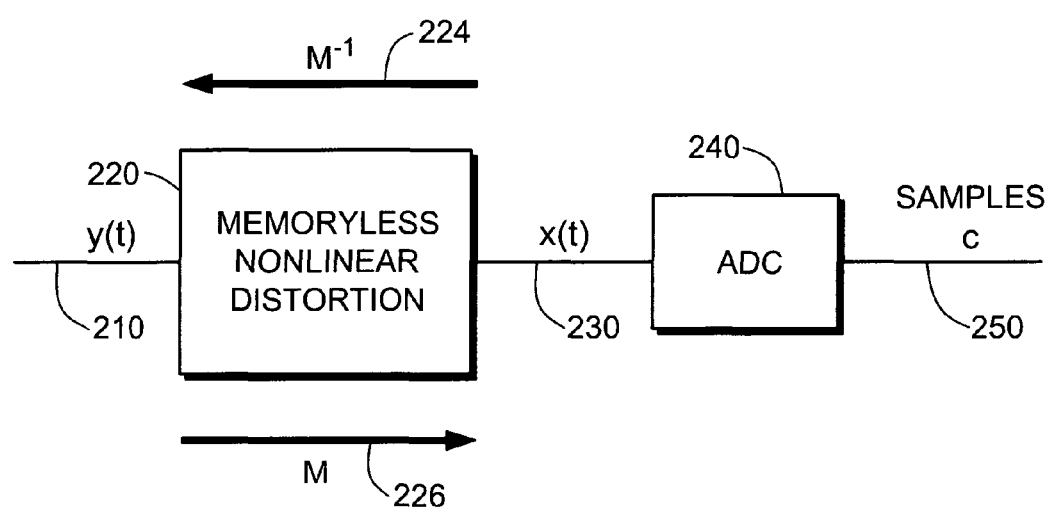
FIG. 2 describes a digitizing process of an analog signal that introduces a distortion before obtaining samples of the analog signal, in accordance with some exemplary embodiments of the disclosed subject matter.

FIG. 2 describes a digitizing process of an analog signal that introduces a distortion before obtaining samples of the analog signal, in accordance with some exemplary embodiments of the disclosed subject matter. An analog signal 210, denoted by y(t), of a predetermined subset, denoted by A, is modified by a distortion 220. In an exemplary embodiment of the subject matter, the predetermined subset may be in the form of a subspace which is spanned by a set of predetermined functions, as is known in the art. In some exemplary embodiments of the disclosed subject matter, the distortion 220 may be nonlinear. The distortion 220 applied on the analog signal 210 to produce a distorted analog signal 230, denoted by x(t). Schematically, a "direction" of applying the distortion 220 on the analog signal 210 is represented by a first arrow 226, denoted by M. A schematic representation of an inverted distortion is denoted by $M^{-1}$ and showed by a second arrow 224. It will be noted that in some exemplary embodiments of the disclosed subject matter, the distortion may not necessarily be invertible or memoryless. The distorted analog signal 230 is sampled by an ADC 240 which obtains samples 250 of the distorted signal 230. The samples 250 are denoted by c.

FIG. 3 shows a flow diagram of a method for recovering an original analog signal that was distorted by a first distortion and sampled by a first sampler, in accordance with some exemplary embodiments of the disclosed subject matter. In some exemplary embodiment, the first distortion is a nonlinear distortion. In other exemplary embodiments, the first distortion is a linear distortion and it may either be a dynamic or memoryless distortion. In yet other exemplary embodiments of the disclosed subject matter, the distortion may be described by a Wiener-Hammerstein model, or some other model. A Wiener-Hammerstein system is a composition of a linear mapping followed by a memoryless nonlinear distortion which is further followed by an additional linear mapping. In step 300, the original analog signal is sampled after being distorted using an ideal or non-ideal sampling process. An ideal sampling process produces point-wise evaluations of the original analog signal after being distorted. A non-ideal sampling process provides similar evaluations but also introduces an additional distortion, such as anti-aliasing effects of an ADC. In step 310, an initial analog signal is obtained. The initial analog signal is a member of a predetermined subset of analog signals. The predetermined subset describes prior information about characteristics of the original analog signal. In an exemplary embodiment of the subject matter, the predetermined subset is a subspace that is spanned by a set of predetermined functions. For example, the original analog signal may be composed of two high frequency, narrow band components; a contribution at a carrier frequency of $f_0=550$ MHz and at $f_1=600$ MHz. A bandwidth of each component may be set to 8 MHz. In this example, the predetermined subset is a subspace is spanned by $\{sinc(t/T-n)cos(2\pi f_0 t)\}_n$ and $\{sinc(t/T-n)cos(2\pi f_1 t)\}_n$ with $T<1/16$ MHz. Hence, the subspace is composed of two narrow band regions around 550 and 600 MHz. Given any analog signal of the predetermined subset, including a signal representing a zero function, the disclosed subject matter may be utilized to reconstruct the original analog signal. Other examples may include signals that are sparse; for example, signals whose energy is contained in a possibly unknown set of frequency bands. Other exemplary signals may be defined over a union of short time intervals, which may or may not be known. In an exemplary embodiment, the predetermined subset is a subspace. In such a setting, the initial analog signal may be generated from the predetermined subspace in respect to the aforementioned predetermined functions. The zero function is a valid member of any subspace, and hence may be used as the initial analog signal. The zero function is also sparse and therefore can serve as an initialization in such a setting as well. In some exemplary embodiments of the subject matter, an analog signal of the predetermined subset may be uniquely represented using a coefficients representation, i.e. a vector of numbers. In step 320, a second distortion substantially equivalent to the first distortion is applied on the initial analog signal, producing a distorted version of the initial analog signal. The first distortion or characteristics of the first distortion are known at the time the method of the disclosed subject matter is performed. The distorted version is sampled in step 330, using a second sampler that is substantially equivalent to the first sampler. A person skilled in the art will appreciate that in case the initial analog signal is equivalent to the original analog signal, samples obtained in steps 300 and 330 are equivalent. In step 340, the samples obtained in step 300 and step 330 are compared. A set of samples of a signal may be represented using a vector of values. In case a subtraction of two vectors representing the samples obtained in step 300 and step 330 yields a zero vector, one can determine that the original analog signal, represented by the samples obtained in step 300, is equivalent to the initial analog signal, represented by the samples obtained in step 330. An error vector may be defined as a function of a coefficient representation such as for example: e(a)=S*M(Aa)−c, where a is a coefficient representation of an analog signal being compared to the original analog signal; A represents a process of converting the coefficient representation to the analog signal, also referred to as a synthesis process, i.e. Aa is the analog signal being compared to the original analog signal; M represents the second distortion substantially equivalent to the first distortion, i.e. M(Aa) is a distorted version of the analog signal being compared to the original analog signal; S* denotes a sampling process of an analog signal, hence, in this example, S*M(Aa) is a vector representing samples of the distorted version of the analog signal being compared to the original analog signal; and c is a vector representing samples of the original analog signal, as were obtained in step 300. An exemplary cost function, such as $$f(a) = \frac{1}{2}\|e(a)\|^2,$$

where $\|\ \|$ denotes a norm of a vector, may be used to determine a Euclidean distance, or similar distance measure, between the samples of an analog signal represented by a and the original analog signal. When a value of f(a) is zero both analog signals are said to be equivalent for the purpose of the disclosed subject matter. It will be noted that given that a set of sufficient conditions is held both analog signals are truly equivalent. However, the disclosed subject matter may be applied when the set of sufficient conditions does not hold. An exemplary set of sufficient conditions is that the distortion is an ascending nonlinear distortion with a slope no larger than two and that a signal space of all finite energy signals, known in the art and denoted by $L_2$, is a direct sum of the subspace and an orthogonal complement of a sampling space. It is stated for clarity that the disclosed subject matter is not limited by the set of sufficient conditions. In some exemplary embodiments of the subject matter, a value f(a) smaller than a predetermined value may be considered as sufficiently equivalent such that both analog signals may be determined to be substantially equivalent. The predetermined value may be selected in accordance with a desired accuracy level, a numerical precision of a machine utilized in performing the disclosed computations and the like. In some exemplary embodiments of the disclosed subject matter, the predetermined value represents a level of accuracy that is induced by an estimated noise level affecting a signal. A person skilled in the art will appreciate that when noise modifies a signal, eliminating consistency error does not improve an outcome, due to overfitting.

In case step 340 determines that the samples obtained in step 300 and step 330 are not substantially equivalent, step 350 is performed to compute an additional analog signal, or its digital representation, based on the initial analog signal and an appropriate error vector. In some exemplary embodiments of the subject matter, the additional analog signal is computed in order to determine at least one stationary point in a cost function such as f(a). A global minimum value of the cost function is zero, and that value is an image of a coefficient representation of a representation of the original analog signal or its equivalents. Determining the global minimum of the cost function, may be accomplished by determining a stationary point of the cost function. It will be noted that given that a set of sufficient conditions is held, such as the exemplary set of sufficient conditions disclosed above, a cost function has one stationary point and the stationary point is the global minimum of the cost function. However, the disclosed subject matter may be applied when the set of sufficient conditions does not hold. It is stated for clarity that the disclosed subject matter is not limited by the set of sufficient conditions.

After the additional analog signal is computed the flow loops back to step 320 and the additional analog signal is distorted, sampled and compared to the original analog signal in steps 320, 330 and 340. A coefficient representation of an analog signal examined in a n-th iteration of a loop comprising steps 320, 330, 340 and 350 is denoted by $a_n$.

In some exemplary embodiments of the subject matter, a coefficients representation of the additional analog signal may be computed using an inductive equation such as: $a_{n+1}=a_n-\alpha_n(S^*M'_n A)^\backslash e(a_n)$. A correction term is denoted by $(S^*M'_n A)^\backslash e(a_n)$. The correction term is multiplied by a step size denoted by $\alpha_n$. In some exemplary embodiments of the disclosed subject matter the step size is determined by the following algorithm: set $\alpha_n=1$; repeat setting $\alpha_n=0.5\alpha_n$ until $f(a_{n+1})\leq f(a_n)+0.25\alpha_n\langle p_n,\nabla f(a_n)\rangle$, where $p_n$ is a search direction and $\nabla$ denotes gradient, as is known in the art; the operator $T^\backslash$ denotes an inverse of a bounded transformation T, such as a Moore-Penrose pseudo inverse; M denotes a distortion substantially equivalent to the first distortion; and $M'_n$ denotes a Fréchet derivative of the distortion M at $Aa_n$. In another exemplary embodiment of the disclosed subject matter, the sampling process S* and the synthesis process A utilize equivalent functions, as is known in the art. Such precondition may be utilized to simplify the inductive equation to an equation such as: $a_{n+1}=a_n-\alpha_n(a_n)$. It will be apparent to a person skilled in the art that other preconditions may be utilized to simplify the inductive equation. One skilled in the art will further appreciate that different methods may be utilized to produce a stationary point of a cost function such as f(a), for example a series of oblique projections, conjugate gradient method, an approximated projections onto convex sets and quasi-Newton iterations may be utilized.

In case the comparison performed in step 340 determines that samples of a final analog signal substantially equivalent to the original analog signal, the flow passes to step 360 and the method ends. In some exemplary embodiments of the disclosed subject matter, a DAC is utilized to generate an analog signal equivalent to the original analog signal. In other exemplary embodiments of the disclosed subject matter, an output signal that is a function of the final analog signal is generated. One exemplary output signal may be a digital signal representing an ideal sampling of an undistorted version of the original analog signal. Other exemplary embodiments may output a signal representing a characteristic of the original analog signal, such as an amplitude or frequency.

Figure 4:
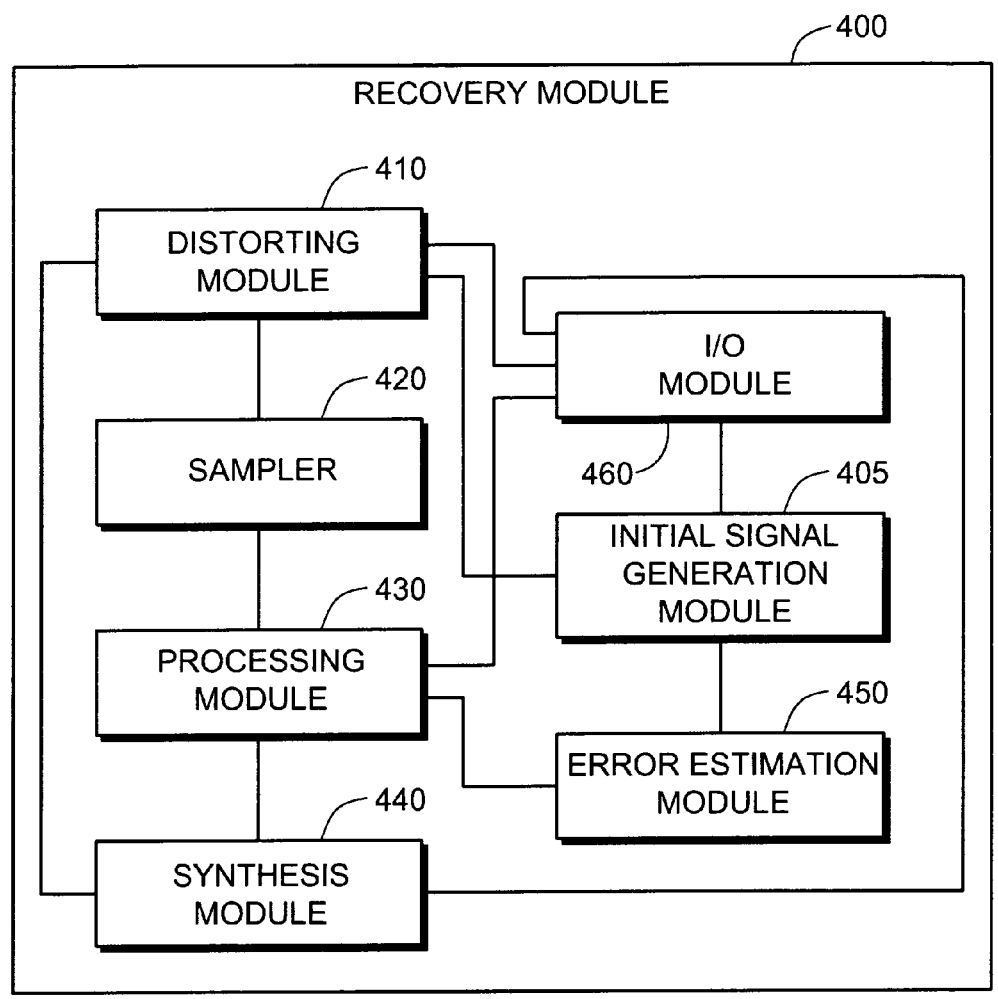
FIG. 4 shows a block diagram of a recovery module, in accordance with some exemplary embodiments of the disclosed subject matter; and, FIG. 5 shows a block diagram of a processing module, in accordance with some exemplary embodiments of the disclosed subject matter.

FIG. 4 shows a block diagram of a recovery module, in accordance with some exemplary embodiments of the disclosed subject matter. A recovery module 400 comprises an initial signal generation module 405, a distorting module 410, a sampler 420, a processing module 430, a synthesis module 440, an error estimation module 450 and an I/O module 460. The I/O module 460 is used to receive samples of a distorted version of an original analog signal. The distorted version of the original analog signal is modified by a first distortion (not shown) and sampled by an original sampler (not shown), which may or may not be part of the recovery module 400. The I/O module 460 is further used to output a recovered signal, or some other output which is derived from the recovered signal, based on the original analog signal, as is described above in relation to step 360 of FIG. 3. The initial signal generation module 405 generates an initial analog signal, as is described above in relation to step 310 of FIG. 3. The initial signal generation module 405 may select the initial analog signal according to predefined parameters or a set of rules from a plurality of optional initial analog signals comprised therein. In some exemplary embodiments, the initial signal generation module 405 comprises or communicating with a storage device comprising parameters, sets of rules or the plurality of optional initial analog signals similar to those described above. The distorting module 410 applies a second distortion on an examined analog signal. The examined analog signal is either the initial analog signal, an analog signal outputted by the synthesis module 440 or an analog signal received as an input by the I/O module 460. The second distortion is substantially equivalent to the first distortion that may be linear or nonlinear. A distortion is said to be substantially equivalent to another distortion in case both distortions, applied on an analog signal, provide substantially equivalent distorted signals. In some exemplary embodiments of the disclosed subject matter, Taylor series may be utilized to approximate the distortion. In other exemplary embodiments, data available at the processing time or predetermined data may be utilized to reevaluate an analog signal to provide an approximation of its distorted version. The sampler 420 is substantially equivalent to the original sampler. As is aforementioned disclosed, the sampler 420 may be an ideal or a non-ideal sampler. A sampler is said to be substantially equivalent to another sampler in case both samplers, applied on an analog signal, provide substantially equivalent discrete sets of values, for example both samplers comprise a low-pass filter having a substantially equivalent band. In some exemplary embodiments of the disclosed subject matter, the recovery module 400 may utilize the original sampler that was used to sample the original analog signal as the sampler 420. The sampler 420 may utilize the original sampler by providing an interface to the original sampler, without adding additional computations or calculation. In some exemplary embodiments, the sampler 420 may utilize the original sampler by providing an interface to it, but by also adding additional computations or calculations. In some exemplary embodiments, the recovery module 400 may utilize a sensor that introduced the original distortion to the original analog signal as the distorting module 410. The distorting module 410 may utilize the sensor by providing an interface to the sensor, without adding additional computations or calculation. In some exemplary embodiments, the distorting module 410 may utilize the sensor by providing an interface to it, but by also adding additional computations or calculations.

Samples obtained by the sampler 420 are provided to the processing module 430 that further determines if the examined analog signal distorted by the distorting module 410 and sampled by the sampler 420 is substantially equivalent to the original analog signal. In case the examined analog signal and the original analog signal are not substantially equivalent, the processing module 430 provides the synthesis module 440 with a representation of a different analog signal that is more likely to be substantially equivalent to the original analog signal. The processing module 430 performs a computation such as described above in relation to step 350 of FIG. 3. The processing module 430 may utilize the error estimation module 450 in determining substantially equivalence of two sampled analog signals and in computing the representation of the different analog signal. The error estimation module 450 may determine error estimations based on an error vector as is described above. In some exemplary embodiments of the disclosed subject matter, the error estimation module 450 further computes an error value using an error function based on the error vector. Such error function may be predetermined, or computed as a function of parameters related to the sampler 420, the original analog signal and the like. The synthesis module 440 generates a signal based on the predetermined subset. The predetermined subset induces prior knowledge on the original signal which may be utilized by the synthesis module 440 in generating the signal. In one exemplary embodiment of the disclosed subject matter, the predetermined subset is a subspace spanned by a set of functions. An exemplary synthesis module 440 uses the coefficients representation as weights of the set of functions and summarizes the outcomes of the weighted functions. The synthesis module 440 is utilized by the processing module 430 to generate the different analog signal which is further transmitted to the distorting module 410, to perform a process such as the exemplary method described in FIG. 3. In another exemplary embodiment of the disclosed subject matter, the synthesis stage may be performed implicitly, since synthesis, distortion and sampling may be all calculated mathematically, in a digital domain.

Figure 5:
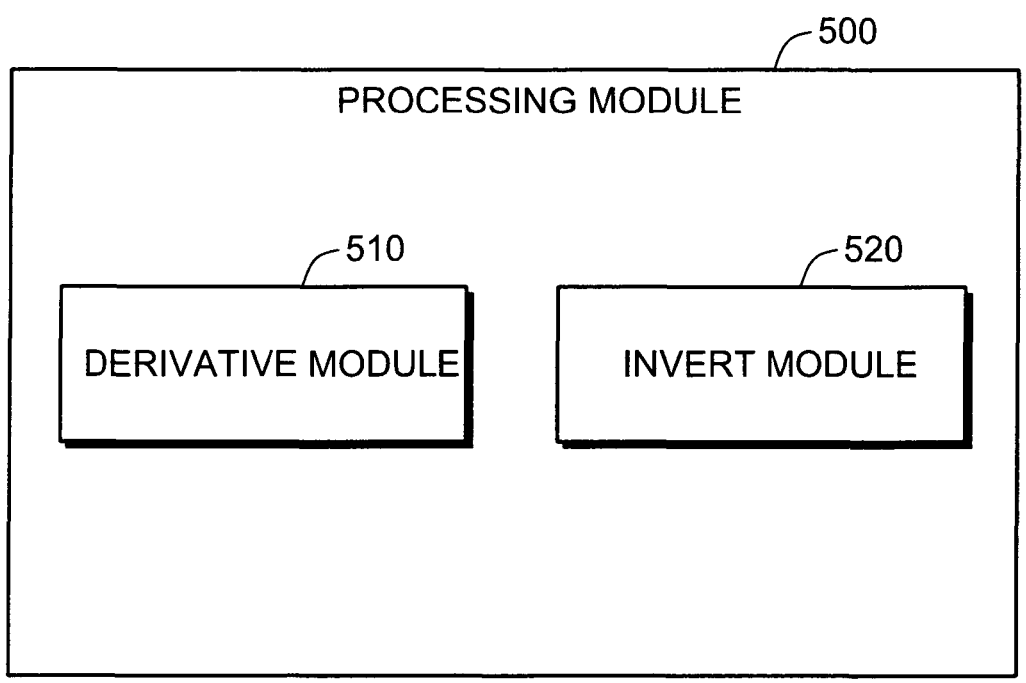

FIG. 5 shows a block diagram of a processing module, in accordance with some exemplary embodiments of the disclosed subject matter. A processing module 500, such as the processing module 430 of FIG. 4, comprises a derivative module 510 and an invert module 520. The derivative module 510 computes a Fréchet derivative of a distortion, such as $M'_n$ described above in relation to FIG. 3. In another exemplary embodiment, the derivative module 510 computes a different derivative, such as the Gateaux derivative. In yet another exemplary embodiment, an approximation of the derivative can be placed in use. The invert module 520 performs an inverse transformation, such as a Moore-Penrose pseudo inverse. The derivative module 510 and the invert module 520 may be utilized in computing the different analog signal that is more likely to be substantially equivalent to the original analog signal. As disclosed above, one exemplary computation of the different analog signal is by computing $a_{n+1}$ using an inductive equation such as $a_{n+1}=a_n-\alpha_n(S^*M'_nA)^ie(a_n)$.

The disclosed subject matter may be utilized in many different embodiments. Several additional exemplary embodiments are disclosed below. Such embodiments are not provided to limit the scope of the disclosed subject matter, rather to further exemplify the working and applications of the disclosed subject matter.

Air pressure may be measured using a transducer. The relation between the air pressure and altitude is nonlinear. A linear pressure sensor that outputs voltage readings as a linear function of an air pressure may be used and an altitude level may be inductively computed as described above based on known relation between air pressure and altitude.

A thermistor is a device which changes its resistance based on surrounding temperature. The relation between the temperature and the resistance is known to be nonlinear. An analog signal representing the resistance may be used to produce a signal representing the temperature based on calculations as described above.

A resistance thermometer is a device that measures temperature. The resistance thermometer often utilizes platinum, because of its linear resistance-temperature relationship. Hence, utilizing the disclosed subject matter, similar devices which employ cheaper materials—which have nonlinear resistance-temperature relationship—may be used, as the resistance variation may be compensated using the disclosed subject matter.

An electro-galvanic fuel cell is an electrical device used to measure a concentration of oxygen gas in scuba-diving and medical equipment. Based on a chemical reaction, oxygen is translated to electrical current and gives a measure of the oxygen level. In some cases, such a sensor may create a nonlinear relationship across its range of oxygen pressures, resulting in a potential for decompression illness. If the nonlinearity is known in advance or is being estimated, the disclosed subject matter can be utilized to mitigate it.

A high power amplifier introduces nonlinear distortion for excessive input levels. Hence, the disclosed subject matter may be utilized to remove the nonlinear distortion.

As stated above, in some exemplary embodiments of the disclosed subject matter a distortion may be described by a Wiener-Hammerstein model.

A Wiener-Hammerstein system is a composition of a first linear mapping followed by a memoryless nonlinear distortion which is further followed by a second linear mapping. In an exemplary embodiment of the disclosed subject matter, a predetermined subspace of an original analog signal is known.

The disclosed subject matter may be utilized by modifying the predetermined subspace using the first linear mapping. The second linear mapping is attributed to a sampler. If the sampler introduces a third linear distortion, a distortion representing both the second linear mapping and the third linear distortion may be modeled as a fourth linear mapping, as is known in the art. Hence, the disclosed subject matter may be applied to retrieve a modified analog signal of the modified subspace. Retrieving the original analog signal is determined using the first linear mapping and the modified analog signal, as is known in the art. Wiener-Hammerstein systems may be utilized in the art in many types of apparatuses. For example, some amplifiers introduce a distortion that can be described by a Wiener-Hammerstein model. A person skilled in the art will appreciate that there exist multiple embodiments and variations exist which follow the guidelines of the disclosed methods and apparatus. Multiple implementations may exist for determining connections between categories or keyphrases, based on multiple factors, and expressed as a multiplicity of formulae. There may also exist numerous representation options which demonstrate the connections and the connections' intensity.

One technical effect of the disclosed subject matter is to provide solution to reconstructing an original analog signal based on non-ideal samples of a distorted version of the original analog signal. The solution generally discloses an iterative process of reconstructing the original analog signal.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation, material, step of component to the teachings without departing from the essential scope thereof. Therefore, it is intended that the disclosed subject matter not be limited to the particular embodiment disclosed as the best mode contemplated for carrying out this invention, but only by the claims that follow.

The invention claimed is:

1. A method for recovering an original analog signal from a sampling of the original analog signal, the method comprising:
    obtaining the samples by applying a first distortion to the original analog signal forming a distorted original analog signal and then sampling the distorted original signal by a first digitizing process forming a representation of digitized samples of the original signal;
    calculating a signal representing an initial approximation of the original analog signal;
    reconstructing the original analog signal by:
        (a) applying a second distortion on the calculated signal forming a distorted calculated signal; wherein said second distortion is substantially equivalent to the first distortion;
        (b) sampling the distorted calculated signal by a second digitizing process; wherein said second digitizing process is substantially equivalent to the first digitizing process forming a representation of digitized samples of the distorted calculated signal;
        (c) comparing the representations by forming an error representation of the difference between the representations of the digitized samples of the original signal and the digitized samples of the calculated signal;
    if the representations are substantially equivalent then the calculated signal is considered to be substantially equivalent to the original signal and the calculated signal is output; otherwise the error representation is used to calculate a refined approximation of the original signal and the reconstructing of the original signal is performed iteratively using the refined calculated signal.

2. The method of claim 1, wherein reconstructing the original analog signal is performed in a digital domain.

3. The method of claim 1, wherein reconstructing the original analog signal is performed in an analog domain.

4. The method of claim 1, wherein calculating a signal representing an initial approximation of the original analog signal comprises generating the calculated signal as a function of known characteristics of the original analog signal.

5. The method of claim 4, wherein the original analog signal is an electrical or electromagnetic signal.

6. The method of claim 1, wherein the distortion is a non-linear distortion.

7. The method of claim 6, wherein the first digitizing process is a non-ideal sampling process.

8. The method of claim 7, wherein the original analog signal represents audio data.

9. The method of claim 7, wherein the original analog signal represents visual or image data.

10. The method of claim 6, wherein the original analog signal represents temperature, air pressure or chemical process.

11. The method of claim 1, wherein said step of reconstructing the original analog signal is performed by determining a stationary point in an error function based on the error representation.

12. The method of claim 1, wherein said calculated signal is also output upon a sufficient convergence of the calculated analog signal.

13. The method of claim 12, wherein the first digitizing process is a non-ideal sampling process.

14. The method of claim 11, wherein said determination of the stationary point utilizes an inductive equation; the inductive equation is $a_{n+1}=a_n-\alpha_n e(a_n)$.

15. The method of claim 14, wherein said determination of the stationary point utilizes a derivative.

16. The method of claim 15, wherein said determination of the stationary point utilizes an inductive equation; the inductive equation is $a_{n+1}=a_n-\alpha_n(S^*M'_n A)^\dagger e(a_n)$.

17. An apparatus for reconstructing an original analog signal, comprising:
    an input/output (I/O) module for receiving a representation of digitized samples of a distorted version of the original analog signal distorted by a first distortion;
    an initial signal generator for generating an initial calculated signal of an approximation of the original analog signal;
    a distorting module for applying a second distortion on the calculated signal forming a distorted calculated signal; wherein said second distortion is substantially equivalent to the first distortion;
    a sampler for sampling the distorted calculated signal forming a representation of digitized samples of the calculated signal; wherein said sampler performs a sampling process that is substantially equivalent to a sampling process that obtained the digitized samples of the distorted version of the original analog signal; and
    a processing module for
        comparing the representations by forming an error representation of the difference between the representation of the digitized samples of the original signal and the digitized samples of the calculated signal;
        if the representations are substantially equivalent then the calculated signal is considered to be substantially equivalent to the original signal and the calculated signal is output from the I/O module by the processing module;
        otherwise the error representation is used to calculate a refined approximation of the original signal and the reconstructing of the original signal is performed iteratively using the refined calculated signal.

18. The apparatus of claim 17 further comprising an error estimation module that compares the representations for the processing module.

19. The apparatus of claim 17, wherein the first distortion is a nonlinear distortion.

20. The apparatus of claim 17, wherein the sampler is a non-ideal sampler.

21. The apparatus of claim 17 further comprising a digital-to-analog converter to create the calculated signal.

22. The apparatus of claim 17, wherein at least one of said distorting module, said sampler and said processing module operate in a digital domain.

23. The apparatus of claim 17, wherein said distorting module utilizes a module that caused the first distortion.

24. The apparatus of claim 17 wherein said sampler utilizes sampler module that performed the sampling process that obtained the samples of the distorted version of the original analog signal.

* * * * *